United States Patent
Flaherty et al.

(10) Patent No.: US 8,683,681 B2
(45) Date of Patent: Apr. 1, 2014

(54) ROOM TEMPERATURE LOW CONTACT PRESSURE METHOD

(75) Inventors: Luke M. Flaherty, Long Beach, CA (US); Randal E. Knar, Seal Beach, CA (US)

(73) Assignee: Raytheon Company, Waltham, MA (US)

( * ) Notice: Subject to any disclaimer, the term of this patent is extended or adjusted under 35 U.S.C. 154(b) by 279 days.

(21) Appl. No.: 12/962,206

(22) Filed: Dec. 7, 2010

(65) Prior Publication Data

US 2012/0137511 A1   Jun. 7, 2012

(51) Int. Cl.
*H01R 43/00* (2006.01)

(52) U.S. Cl.
USPC ............................ 29/825; 29/846; 29/852

(58) Field of Classification Search
USPC ............................................ 29/825, 846, 852
See application file for complete search history.

(56) References Cited

U.S. PATENT DOCUMENTS

| | | | |
|---|---|---|---|
| 3,409,732 A * | 11/1968 | Dahlgren et al. | 174/254 |
| 4,037,047 A * | 7/1977 | Taylor | 174/254 |
| 4,800,461 A * | 1/1989 | Dixon et al. | 361/751 |
| 5,004,639 A * | 4/1991 | Desai | 174/254 |
| 5,206,463 A * | 4/1993 | DeMaso et al. | 174/254 |
| 5,214,571 A | 5/1993 | Dahlgren et al. | |
| 5,432,998 A * | 7/1995 | Galasco et al. | 29/830 |
| 5,499,444 A * | 3/1996 | Doane et al. | 29/830 |
| 5,509,196 A * | 4/1996 | Davis et al. | 29/830 |
| 8,232,476 B2 * | 7/2012 | Nakamura et al. | 174/254 |
| 2003/0194913 A1* | 10/2003 | Randall et al. | 439/677 |
| 2008/0047135 A1* | 2/2008 | Arnold | 29/829 |

FOREIGN PATENT DOCUMENTS

JP        9331153        12/1997

* cited by examiner

*Primary Examiner* — Carl Arbes
(74) *Attorney, Agent, or Firm* — Thorpe North & Western LLP

(57) ABSTRACT

In one or more aspects of the present disclosure, a method is disclosed for fabricating a rigid flex cable assembly. The method includes arranging one or more layers of a polyimide film having an electrically-conductive surface into a stack; applying an adhesive to the one or more layers of polyimide film; arranging a top and a bottom polyimide film to a top portion and a bottom portion of the stack to form the rigid flex circuit board; and selecting a suitable pressure and temperature at which to form the rigid flex assembly such that the one or more layers of polyimide film do not move with respect to one another during the fabrication.

17 Claims, 9 Drawing Sheets

COST AND CYCLE TIME ANALYSIS

STANDARD VS NOVEL APPROACH

ASSUMPTIONS:
(1) ASSUME $75/HOUR ASSEMBLY LABOR
(2) STANDARD APPROACH - HIGH TEMPERATURE HIGH CONTACT PRESSURE FLEX ASSEMBLY
(3) NOVEL APPROACH - ROOM TEMPERATURE LOW CONTACT PRESSURE FLEX ASSEMBLY

| ITEM # | | LABOR HOURS STANDARD METHOD | LABOR HOURS NOVEL APPROACH | ASSEMBLY LABOR COST ($/HR) | STANDARD METHOD ($) | NOVEL APPROACH ($) |
|---|---|---|---|---|---|---|
| 1 | NEW ADHESIVE COST PER FLEX ASSEMBLY | | | | 50 | 10 |
| 2 | FABRICATION OF INNER LAYERS | 4 | 4 | 75 | 300 | 300 |
| 3 | LAMINATION TIME | 12 | 0.5 | 75 | 900 | 37.50 |
| 4 | Mfg AIDE - HIGH PRESSURE TOOLING PLATES | 3 | | 75 | 225 | |
| 5 | Mfg AIDE - LOW PRESSURE CLAMPING | | 1 | 75 | | 75 |
| 6 | INSPECTION TIME | 0.5 | 0.5 | 75 | 37.50 | 37.50 |
| 7 | FLASH REMOVAL (PER FLEX ASSEMBLY) | 0.25 | 0.25 | 75 | 18.75 | 18.75 |
| 8 | SUPPORT SUPERVISION (~10% OF LABOR TIME) | 2 | 0.75 | 75 | 150.00 | 56.25 |
| TOTALS: | | 21.75 | 7 | | 1681.25 | 535 |

UNIT COST SAVINGS: $1,146
CYCLE TIME SAVINGS: 1.7 DAYS

PROGRAM LEVEL SAVINGS (ASSUME 1,000 UNITS): 1,000 X $1,146/UNIT = $1.15M

FIG. 10

ROOM TEMPERATURE LOW CONTACT PRESSURE METHOD

BACKGROUND

This disclosure relates generally to the field of rigid flex cable assemblies and, more specifically, to a method and a product made according to the method for a room temperature low pressure contact pressure method for rigid flex cable adhesive bonding systems.

Flexible printed circuit boards are widely used in consumer and industrial appliances and in appliances for telecommunications. Such boards comprise a flexible, dielectric substrate, one or more conductors carried on at least one surface of the substrate, a coverlay electrically insulating the conductors, and one or more electrical contacts in electrical communication with the conductors and extending through and beyond the coverlay.

A majority of rigid flex cable assemblies are fabricated using a lamination process with moderate to high pressure (e.g., 50-250 psi) and relatively high temperature (e.g., 180-300° C.). When this process is employed, the cycle time for a material set-up and equipment preparation can yield a single "qualified" good or acceptable part in an 8 hour period. This methodology was developed in the early 1970's and has since continued. The standard high temperature method was developed to eliminate one process step and combine three separate assemblies (right and left rigid sections and a connecting flexible middle section). However, during fabrication, if any anomalies occur in the process (movement of layers due to pressure and lay-up geometry/tooling, or movement of layers due to plastic deformation during the cure, or introduction of de-lamination due to foreign contaminants), then the cost savings for minimizing the three sections into one assembly is lost. The undesirable alternative is a high cost remake of the assembly or a time consuming manual process requiring specialized repair fixtures.

Given the above problems with the conventional lamination process, what is needed is a system and method for forming rigid flex cable assemblies using low pressure bonding process at room temperatures that are less costly and cumbersome to produce.

SUMMARY

As described in the various aspects of the present disclosure, a method of fabricating a rigid flex cable assembly is disclosed. The method can include arranging one or more layers of a polyimide film having an electrically-conductive surface into a stack; applying an adhesive to the one or more layers of polyimide film; arranging a top and a bottom polyimide film to a top portion and a bottom portion of the stack to form the rigid flex circuit board; and selecting a suitable pressure and temperature at which to form the rigid flex assembly such that the one or more layers of polyimide film do not move with respect to one another during the fabrication.

In some aspects, pressure between about 1 psi and 10 psi at a temperature between about 20° and 25° C. can be applied to the rigid flex assembly. The electrically-conductive surface can include copper, gold, nickel, silver, aluminum, composites of copper and tin or lead alloy, composites of copper, nickel and antimony, composites of copper, nickel and gold, and composites of nickel, gold or silver. The electrically-conductive surface can be arranged on a top side, a bottom side or both of the polyimide film. The pressure can be between about 2 psi and 5 psi and be applied for about 30 minutes. The adhesive can include an acrylic-based adhesive, a room temperature curing silicone adhesive, a solvent blocked silicone adhesive, a flexible anaerobic adhesive, or a frozen preform adhesive. The method can include arranging a first layer of thermoplastic film to the top of the rigid flex circuit board and a second layer of thermoplastic film to the bottom of the rigid circuit board. In some aspects, the thermoplastic film can include a fluoropolymer resin. In some aspects, the method can include preparing the electrically-conductive surface according to a predetermined circuit configuration. A product can then be formed by this method including rigid flex circuits, flexible cable interconnects, energy absorptive base plates, packaging/container for shipping applications and various automotive products.

In accordance with some aspects of the present disclosure, a method of fabricating a rigid flex cable assembly. The method can include applying a suitable pressure at a suitable temperature to a stack of one or more layers of a polyimide film having an electrically-conductive surface and an adhesive between the one or more layers of polyimide film to produce a rigid flex cable assembly such that the one or more layers of polyimide film do not move with respect to one another during the fabrication.

In some aspects, the pressure can be between 1 psi and 10 psi at a temperature of about 23° C. The electrically-conductive surface can include copper, gold, nickel, silver, aluminum, composites of copper and tin or lead alloy, composites of copper, nickel and antimony, composites of copper, nickel and gold, and composites of nickel, gold or silver. The electrically-conductive surface can be arranged on a top side, a bottom side or both of the polyimide film. The pressure can be applied for about 30 minutes. The adhesive can include an acrylic-based adhesive, a room temperature curing silicone adhesive, a solvent blocked silicone adhesive, a flexible anaerobic adhesive or a frozen preform adhesive. In some aspects, a product can be formed by this method including rigid flex circuits, flexible cable interconnects, energy absorptive base plates, packaging/container for shipping applications and various automotive products.

These and other features and characteristics, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various Figures. It is to be expressly understood, however, that the drawings are for the purpose of illustration and description only and are not intended as a definition of the limits of claims. As used in the specification and in the claims, the singular form of "a", "an", and "the" include plural referents unless the context clearly dictates otherwise.

BRIEF DESCRIPTION OF THE DRAWINGS

FIG. 10 shows an example cost comparison between a standard approach versus the approach in accordance with aspects of the present disclosure.

DETAILED DESCRIPTION

Figure 1:
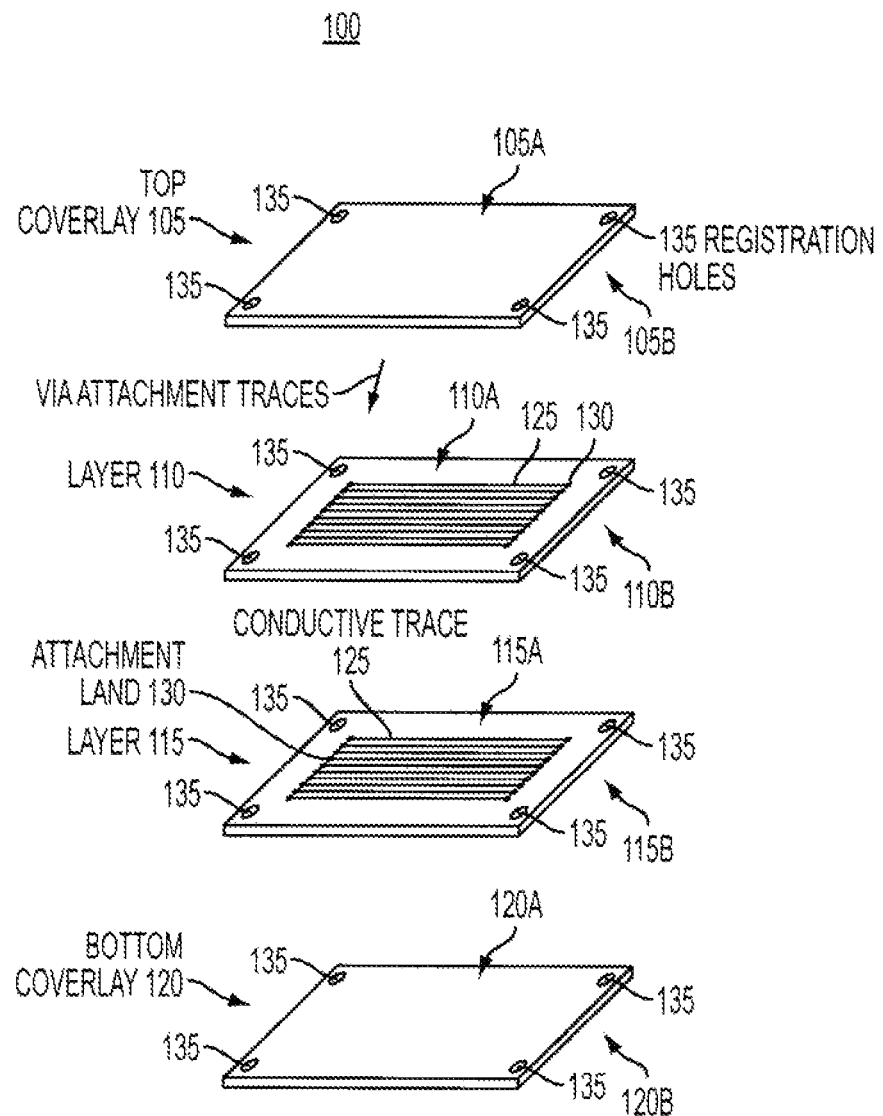
FIG. 1 shows an exploded view of an example flex portion of a rigid flex structure in accordance with aspects of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The conventional rigid flex assembly procedure can be greatly simplified by employing reactive acrylic adhesive coupled with low pressure tooling plates to provide the bonding and process geometries. The lower pressure (2-5 psi gauge pressure) coupled with the lower cure temperature (23° C.) will constrain the adhesive from lowering its viscosity as demonstrated in the standard high temperature high pressure method. Furthermore, as the viscosity of the adhesive decreases (the high temperature and high pressure approach), the melting glue mix acts as a lubricant requiring either additional process steps to minimize movement, or tooling to confine the movement of the lubricated adhesive. Aspects of this approach (room temperature/low contact pressure method) for fabricating a rigid flex assembly will require about 30 minutes of tooling material set-up time and about 30 minutes of bonding cure time once the assembly is fabricated within the low pressure tooling plates. The corresponding time for the standard method is a total of three hours.

In general, there are several reasons why the low pressure, room temperature lamination process in accordance with aspects of the present disclosure are superior to the conventional approach of using high temperatures and pressures. First, reducing internal part stress improves low temperature performance and enables longer flex cable life. Room temperature cure of the adhesive will establish lower inner layer stress between the plastic layers and the adhesive. This stress occurs when the adhesive melts and forms to the plastic. At higher temperatures (conventional method) the least stress is exhibited when operated at high temperature. At room temperature, the conventional method sees stresses in the plastic and adhesive laminate. This is caused by the CTE (coefficient of thermal expansion) mismatch and material dimensional change from processing temperature to room temperature or below.

Second, dimensional stability can be improved during fabrication. All adhesives when heated lower their viscosity for a short time period prior to polymer linkages before establishing the full cure adhesive state. During this lower transition viscosity stage the adhesive acts as a lubricant. As the adhesive wets against the plastic layers, the lubrication effect of the adhesive will allow relative movement between the various layers of the part. In the present approach, room temperature is the only thermal energy imparted. Therefore, the lowering adhesive viscosity is kept to a minimum, the lubricating factor is negated and the relative registration between the layers is maintained.

Third, cycle time/labor content can be reduced. Conventional rigid flex methods require the platens and press to be heated along with the fabricated part. When the laminated flex cable is removed, substantial time must be allowed for the assembly and manufacturing aids to cool prior to platen disassembly and part de-flashing. The present approach is done at room temperature which requires no heating process or cure and eliminates the post laminate cool down period. De-flashing of the part can be done at the end of the lamination cure cycle.

Further, equipment requirements and costs can be reduced. Room temperature processing eliminates the need for heating ovens. Moreover, reduced cycle time, labor content and less equipment requirements significantly reduces cost.

FIG. 1 shows an exploded view of an example flex portion of a rigid flex structure in accordance with aspects of the present disclosure. The flex portion of the rigid flex structure, shown generally as 100, comprises top coverlay 105 having top side 105A and bottom side 105B, intermediate layer 110 having top side 110A and bottom side 110B, intermediate layer 115 having top side 115A and bottom side 115B and bottom coverlay 120 having top side 120A and bottom side 120B. A "coverlay" is a non adhesive dielectric that contains no electronic conductors. Its purpose is to mechanically and chemically protect features and circuits that are bonded underneath. FIG. 1 shows two intermediate layers for illustration only. More than one intermediate layer may be used in the assembly of the instant rigid flex structure. For example, layers 105, 110, 115 and/or 120 can include a polymer, such as polyimide, which is a polymer of imide monomers. Examples of polyimide films include APICAL® Polyimide Film sold by the Kaneka Corporation, KAPTON® sold by DuPont, UPILEX® sold by Ube Industries and KAPTREX sold by Professional Plastics. Other suitable polyimide films may also be used. Layers 110 and 115 can include conductive trace regions 125 and one or more attachment lands 130. Layers 105 and 120 can include one or more registration holes 135. Coverlays 105 and 120 are arranged to provide environmental protection and dielectric insulation to the innerlayer.

In some aspects, intermediate layers 110 and 115 can include electrically-conductive surface such as copper, gold, nickel, silver, aluminum, composites of copper and tin or lead alloy, composites of copper, nickel and antimony, composites of copper, nickel and gold, and composites of nickel, gold or silver. The electrically-conductive surface can be arranged on a top side, a bottom side or both of the polyimide film. This intermediate layers can then be imaged and etched to form the conductive pattern using conventional printed wiring board procedures and equipment. The electrical conductor layers can be patterned as desired by photo printing the desired circuit pattern on the material normally utilizing a negative photo resist. After the photo printing operation, the unwanted copper is etched and the electrical conductors are established in the desired pattern on the copper substrate.

In some aspects, first layer of thermoplastic film can be arranged on the top of the rigid flex circuit board and a second layer of thermoplastic film can be arranged on the bottom of the rigid circuit board. In some aspects, the thermoplastic film can include a fluoropolymer resin.

Figure 2:
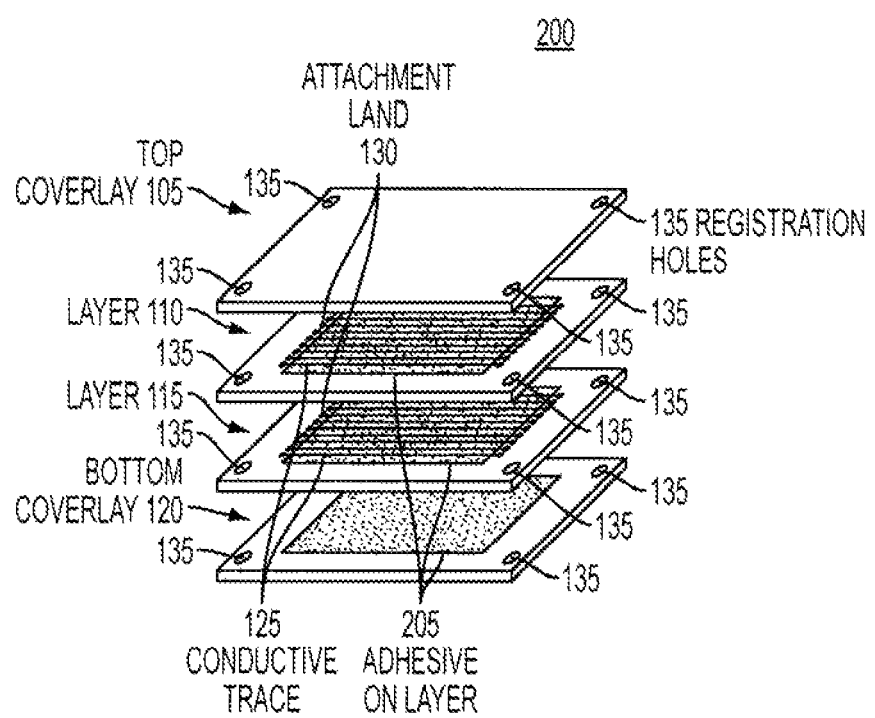
FIG. 2 shows the view of FIG. 1 with the addition of an adhesive applied to the flex portion of the rigid flex structure.

FIG. 2 shows the view of FIG. 1 with the addition of an adhesive applied to the flex portion of the rigid flex structure. The flex portion of the rigid flex structure, shown generally as 200, include the addition of adhesive 205 that can be applied to top side 110A of intermediate layer 110, top side 115A of intermediate layer 115 and top side 120A of bottom coverlay 120. Alternatively or additionally, adhesive 205 may be applied to bottom side 105B of top coverlay 105, bottom side 110B of intermediate layer 110, bottom side 115B of intermediate layer 115. Adhesive 205 can include an acrylic-based adhesive, a room temperature curing silicone adhesive, a solvent blocked silicone adhesive, a flexible anaerobic adhesive, or a frozen preform adhesive. In aspects where a frozen preform adhesive is used, a frozen "B" stage preform can be used by selecting any of the acrylic, silicone or anaerobic adhesive which requires an "A" component and "B" component mixture which is then formed prior to use pressed into a sheet and stored at about −40 degrees C. For example: mixture of 5 parts "A" to 1 part "B" Arathane 5753 adhesive or 1 part "A" to 1 part "B" of the 3M DP 810 adhesive. Press to a flat sheet and store at −40 degrees C. prior to use.

Figure 3:
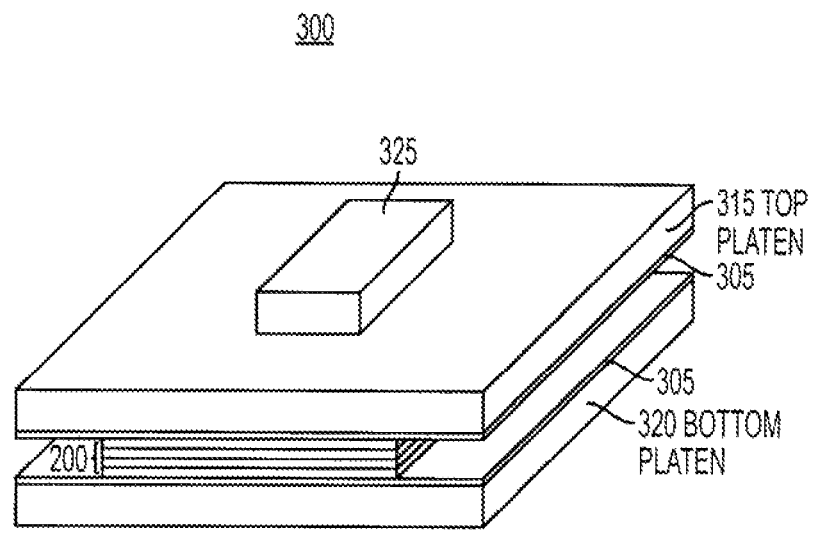
FIG. 3 shows an example low pressure and room temperature bonding apparatus for use with the flex portion of the rigid flex structure of FIG. 2.

FIG. 3 shows an example low pressure and room temperature bonding apparatus for use with the flex portion of the rigid flex structure of FIG. 2. Rubber mat and release film 305 can be positioned on either side of flex portion of the rigid flex structure 200, which can be placed between top platen 315 and bottom platen 320. Top platen 315 can be of sufficient size and mass to impart a pressure of about 1 to 10 psi, for example about 5 psi, to structure 200 while at about room temperature, for example between about 20° and 25° C. Weight 325 can be added to top platen 315 if top platen 315 is not of sufficient size and mass to impart the required pressure on structure 200. Pressure can be applied to structure 200 for about 30 minutes until structure 200 is sufficiently formed.

Figure 4:
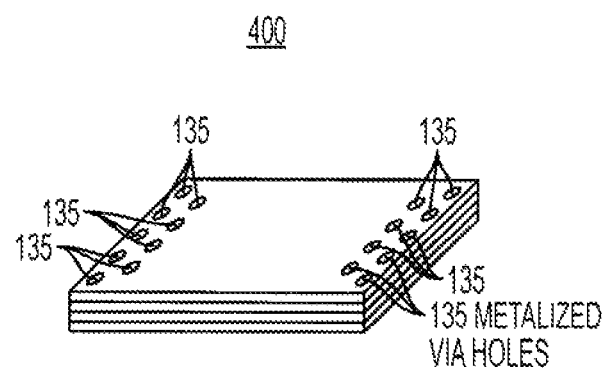
FIG. 4 shows a result of the bonding process of FIG. 3 and the drilled/metalized via holes.

FIG. 4 shows a result of the bonding process of FIG. 3. Layers 105, 110, 115 and 120 are bonded together and drill/metallizing via/tooling holes 135 are formed by standard rigid flex fabrication methods.

Figure 5:
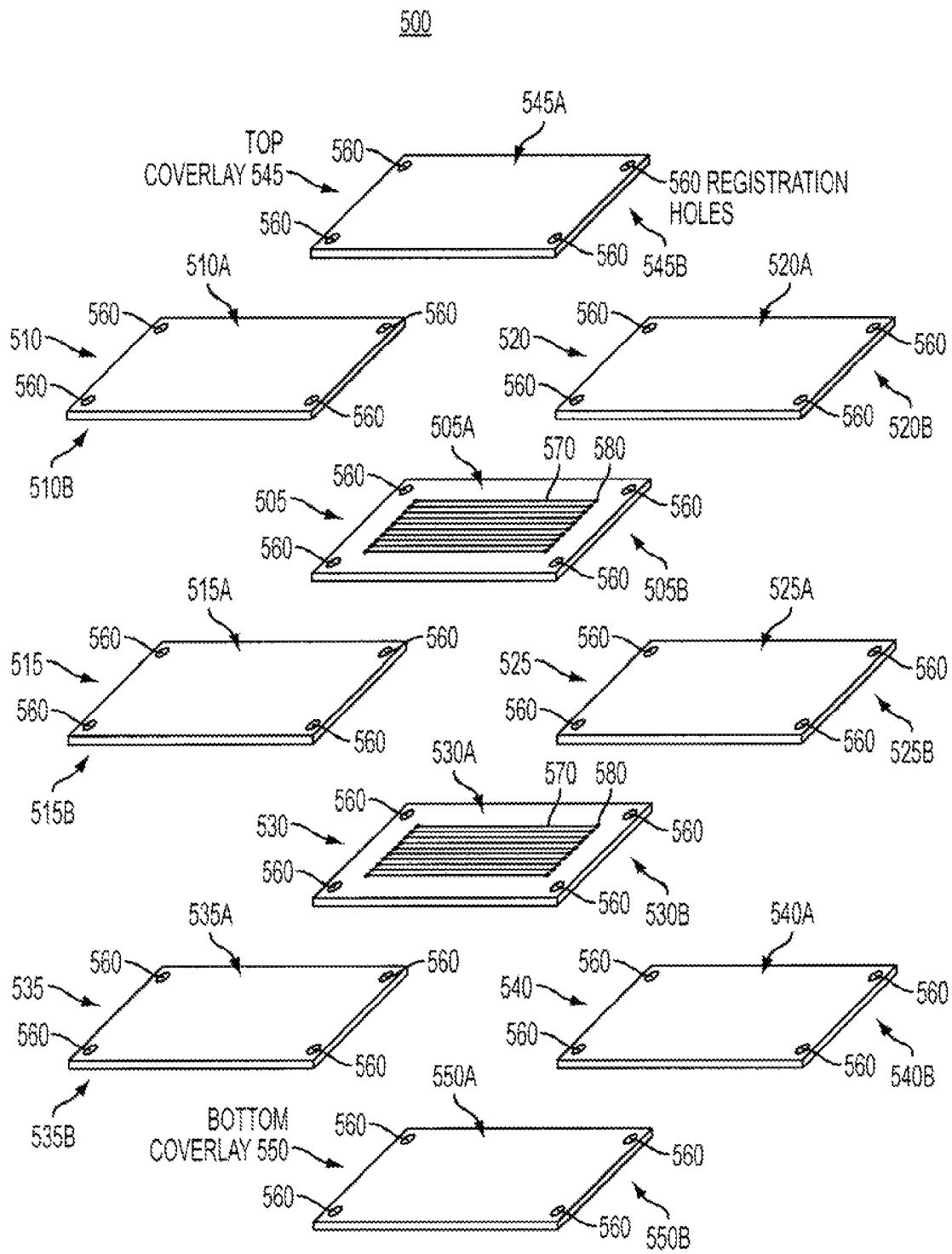
FIG. 5 shows an example exploded view of a portion of a rigid flex structure including both the rigid and the flexible sections in accordance with aspects of the present disclosure.

FIG. 5 shows an example exploded view of a portion of a rigid flex structure including both the rigid and the flexible sections, shown generally as 500. Intermediate flex layer 505 having top side 505A and bottom side 505B can be bordered on one side by rigid layer 510, having top side 510A and bottom side 510B, at top side 505A and by rigid layer 515 having top side 515A and bottom side 515B at bottom side 505B. Intermediate flex layer 505 can be bordered on another side by rigid layer 520 having top side 520A and bottom side 520B at top side 505A and by rigid layer 525 having top side 525A and bottom side 525B at bottom side 505B. Likewise, intermediate flex layer 530 having top side 530A and bottom side 530B can be bordered on one side at top side 530A by bottom side 515B of rigid layer 515 and by rigid layer 535 having top side 535A and bottom side 535B at bottom side 530B. Intermediate flex layer 530 can be bordered on another side at top side 530A by bottom side 525B of rigid layer 525 and by rigid layer 540 having top side 540A and bottom side 540B at bottom side 530B. Top cover layer 545 having top side 545A and bottom side 545B can be positioned over top side 510A, top side 520A and top side 505A. Bottom cover layer 550 having top side 550A and bottom side 550B can be positioned under bottom side 535B, bottom side 540B and bottom side 530B. One or more registration holes 560 can be arranged on the various layers of structure 500. FIG. 5 shows two intermediate layers for illustration only. More than one intermediate layer may be used in the assembly of the present rigid flex structure.

Figure 6:
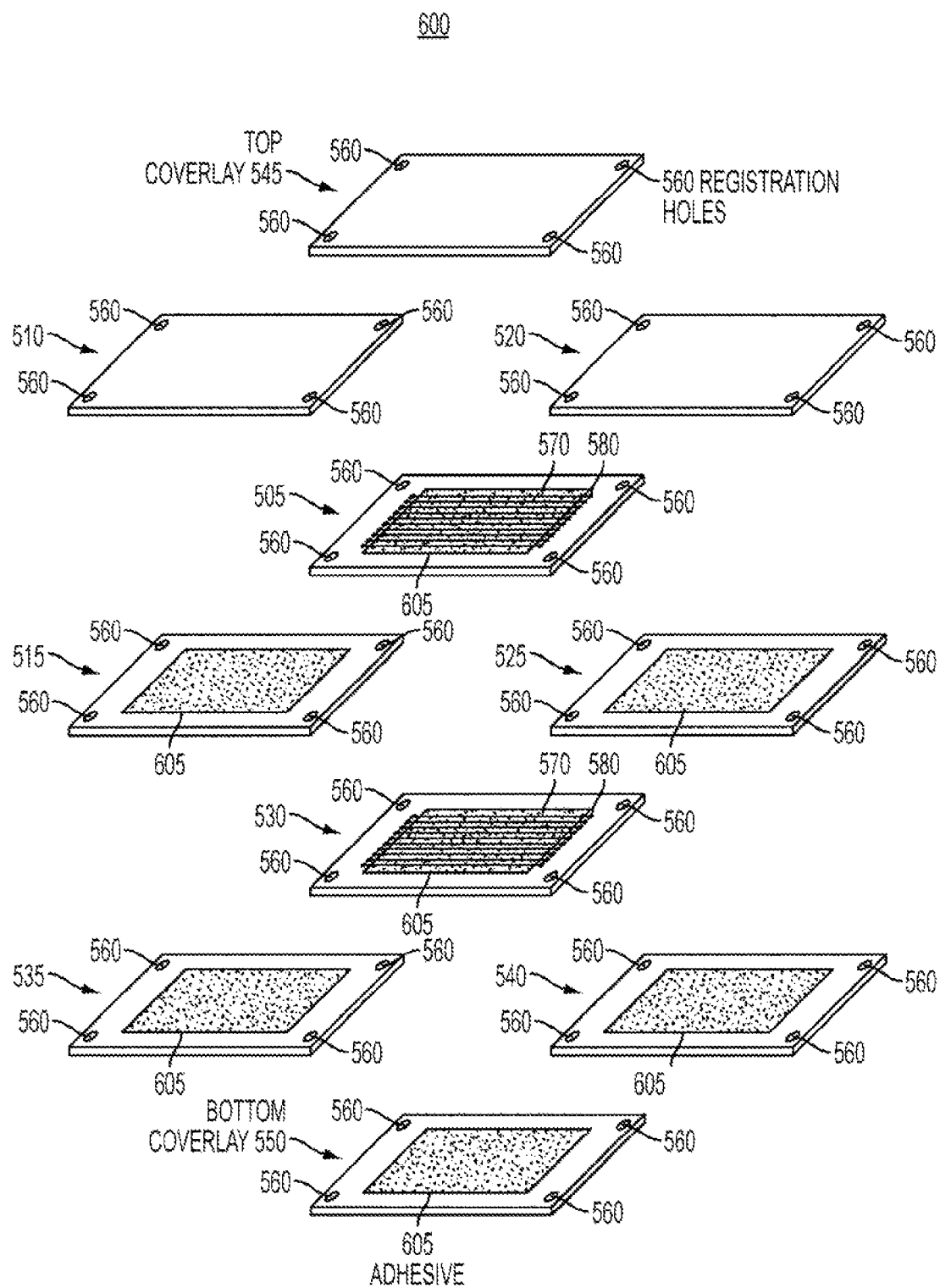
FIG. 6 shows the view of FIG. 5 with the addition of an adhesive applied to portions of structure.

FIG. 6 shows the view of FIG. 5 with the addition of an adhesive applied to portions of structure 500. Adhesive 605 can be applied in a manner similar to that described in relation to FIG. 2 such that adhesive 605 can be applied to top side 505A of intermediate layer 505, top side 530A of intermediate layer 530, top side 515A of rigid layer 515, top side 525A of rigid layer 525, top side 535A of rigid layer 535, top side 540A of rigid layer 540 and top side 550A of cover layer 550. Alternatively or additionally, adhesive 605 may be applied to bottom side 545B of top coverlay 545, bottom side 510B of rigid layer 510, bottom side 520B of rigid layer 520, bottom side 515B of rigid layer 515, bottom side 525B of rigid layer 525, bottom side 505B of flex layer 505, bottom side 530B of flex layer 530, bottom side 535B of rigid layer 535 and bottom side 540B of rigid layer 540. Adhesive 605 can include an acrylic-based adhesive, a room temperature curing silicone adhesive, a solvent blocked silicone adhesive, a flexible anaerobic adhesive, or a frozen preform adhesive.

Figure 7:
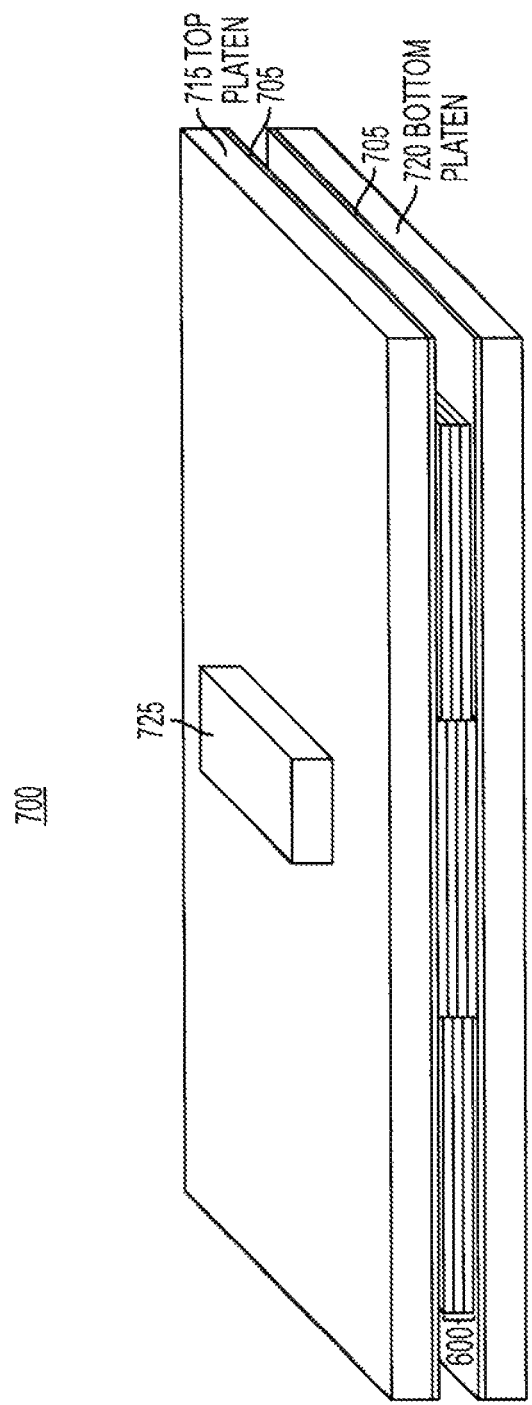
FIG. 7 shows an example low pressure and room temperature bonding apparatus for use with the structure of FIG. 6.

FIG. 7 shows an example low pressure and room temperature bonding apparatus for use with the structure 500 of FIG. 6. Top rubber mat 705 and bottom rubber mat 710 can be positioned on either side of structure 500, which can be placed between top platen 715 and bottom platen 720. Top platen 715 can be of sufficient size and mass to impart a pressure of about 1 to 10 psi, for example about 5 psi, to structure 200 while at about room temperature, for example between about 20° and 25° C. Weight 725 can be added to top platen 715 if top platen 715 is not of sufficient size and mass to impart the required pressure on structure 500. Pressure can be applied to structure 200 for about 30 minutes until structure 500 is sufficiently formed.

Figure 8:
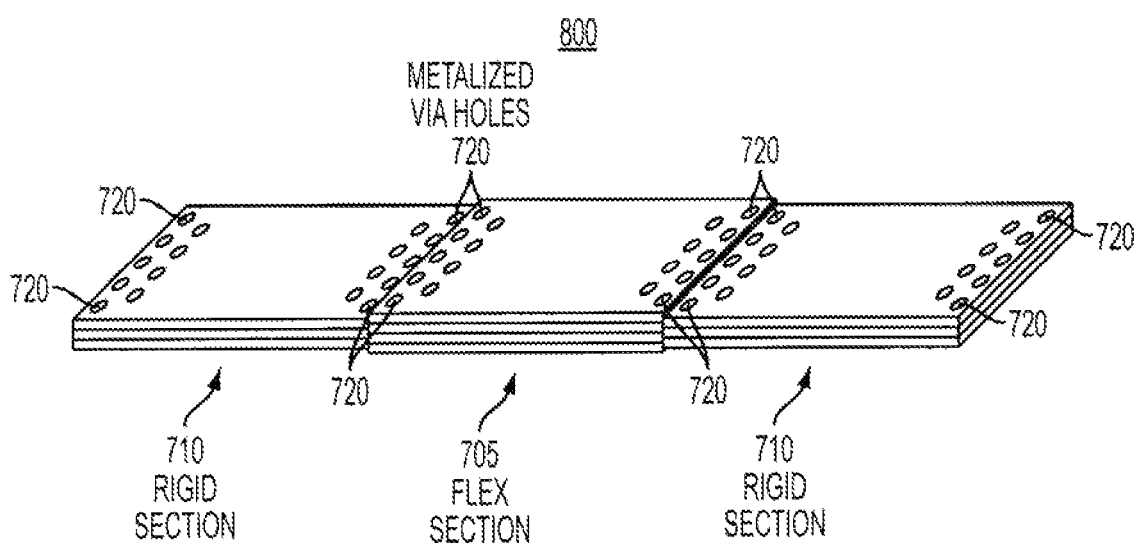
FIG. 8 shows a result of the bonding process of FIG. 7 and the drilled/metalized via holes.

FIG. 8 shows a result of the bonding process of FIG. 7. Flex section 705 is bordered by rigid section 710 and 715 and are bonded together. 720 is one or more of the conductive path formed by the drilled/metalized via holes.

Figure 9:
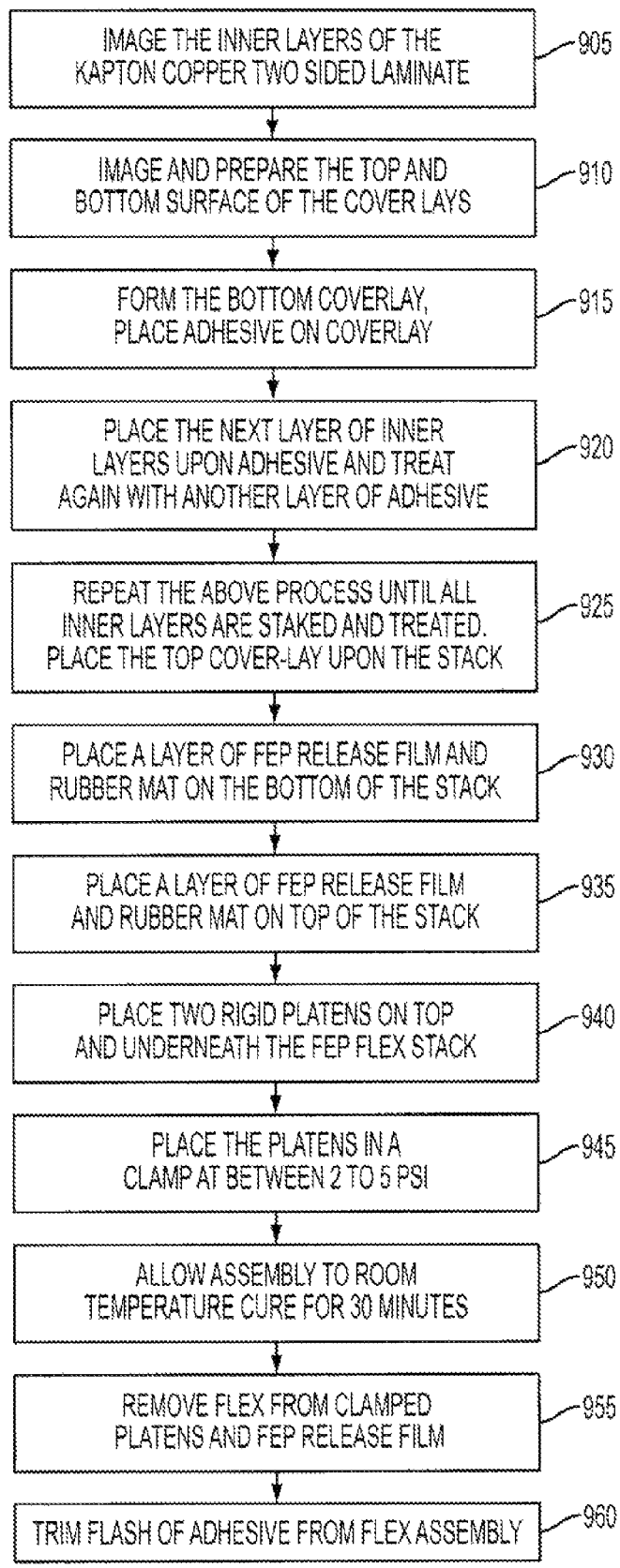
FIG. 9 shows an example method of assembling the rigid flex structure in accordance with aspects of the present disclosure.

FIG. 9 shows an example method of assembling the rigid flex structure in accordance with aspects of the present disclosure. At 905, the inner layers of the Kapton copper two sided laminate are imaged according to a predetermined circuit board configuration. At 910, the top and bottom surface of the cover lays are prepared and imaged. At 915, a small amount of adhesive, such as DP 810 sold by 3M, is applied in the middle of the bottom coverlay. The amount may be 5-25 grams. DP 810 is a room temperature, fast curing, flexible acrylic adhesive, which tends to be beneficial for the present low pressure, room temperature lamination process. At 920, the next layer of inner layers is positioned upon the adhesive and treated again with another layer of adhesive. At 925, the process is repeated until all inner layers are stacked and treated and the top coverlay is positioned upon the stack. At 930, a layer of release film, such as FEP (fluorinated ethylene propylene resin) release film and rubber mat, are positioned on the bottom of the stack. At 935, a layer of FEP release film and rubber are positioned on the top of the stack. At 940, two rigid platens are positioned on top and underneath the FEP Flex stack. At 945, the platens are positioned in a clamp at between 2 to 5 psi. At 950, the assembly is allowed to room temperature cure for 30 minutes. At 955, flex assembly is removed from clamped platens and FEP. At 960, excessive flash or adhesive are trimmed from flex assembly.

Cost Analysis

Standard High Temperature High Contact Pressure Method Assumptions

Assembly labor cost=$75/hour
Cost of new adhesive=$50/flex assembly

Fabrication of inner layers=4 labor hours
Lamination time=8-16 hours
High pressure tooling plates–manufacturing aide=3 hours (fabrication time)
Inspection time after lamination=½ hour
Flash removal=15 minutes/flex assembly
Level of expected flex assembly repair about 10%
Touch-up and Repair=Difficult–typically exceeds the cost of fabricating another flex assembly.

Approach in accordance with aspects of the present disclosure—Room Temperature Low Contact Pressure Flex cable Assembly Method Assumptions
Assembly labor cost=$75/hour
Cost of new adhesive=$10/flex assembly
Fabrication in inner layers=4 labor hours
Lamination time=30 minutes
Low pressure clamping manufacturing aide=1 hour (fabrication time)
Inspection time after lamination=½ hour
Flash removal=15 minutes/flex assembly
Level of expected flex assembly repair about 10%
Touch-up and Repair=Difficult–typically exceeds the cost of fabricating another flex assembly.

As shown in FIG. 10, the implementation of the manufacturing process in accordance with aspects of the present disclosure can reduce the cost of manufacturing a rigid flex cable assembly and reduce cycle time. The unit cost savings is easily calculated at $1,146 or a total savings of $1.1M for 1,000 units built. Cycle time reduction is 1.7 days. Over the course of several years and multiple programs, 10,000 units may be manufactured with a corresponding total savings of $11.5M.

In general, various products can be formed by the present low pressure, room temperature process. These products can include rigid flex circuits, flexible cable interconnects, energy absorptive base plates, packaging/container for shipping applications and various automotive products.

Although the above disclosure discusses what is currently considered to be a variety of useful embodiments, it is to be understood that such detail is solely for that purpose, and that the appended claims are not limited to the disclosed embodiments, but, on the contrary, are intended to cover modifications and equivalent arrangements that are within the spirit and scope of the appended claims.

What is claimed is:

1. A method of fabricating a rigid flex cable assembly comprising:
    arranging one or more layers of a polyimide film having an electrically-conductive surface into a stack;
    applying an adhesive to the one or more layers of polyimide film;
    arranging a top and a bottom polyimide film to a top portion and a bottom portion of the stack to form a rigid flex circuit board;
    disposing the rigid flex circuit board between a top platen and a bottom platen, wherein a flexible portion of the rigid flex circuit board is exposed; and
    selecting a suitable pressure and temperature at which to form the rigid flex assembly such that the one or more layers of polyimide film do not move with respect to one another during the fabrication.

2. The method according to claim 1, wherein the pressure is between about 1 psi and 10 psi at a temperature between about 20° and 25° C.

3. The method according to claim 1, wherein the electrically-conductive surface is selected from the group consisting of: copper, gold, nickel, silver, aluminum, composites of copper and tin or lead alloy, composites of copper, nickel and antimony, composites of copper, nickel and gold, and composites of nickel, gold and silver.

4. The method according to claim 1, wherein the electrically-conductive surface is arranged on a top side, a bottom side or both of the polyimide film.

5. The method according to claim 1, wherein the pressure is between about 2 psi and 5 psi.

6. The method according to claim 1, wherein the pressure is applied for about 30 minutes.

7. The method according to claim 1, wherein the adhesive is selected from the group consisting of: an acrylic-based adhesive, a room temperature curing silicone adhesive, a solvent blocked silicone adhesive, a flexible anaerobic adhesive and a frozen preform adhesive.

8. The method according to claim 1, further comprising arranging a first layer of thermoplastic film to the top of rigid flex circuit board and a second layer of thermoplastic film to the bottom of the rigid circuit board.

9. The method according to claim 8, wherein the thermoplastic film includes a fluoropolymer resin.

10. The method according to claim 1, further comprising preparing the electrically-conductive surface according to a predetermined circuit configuration.

11. A method of fabricating a rigid flex cable assembly comprising:
    forming a rigid flex cable assembly including a stack of one or more layers of a polyimide film having an electrically-conductive surface and an adhesive between the one or more layers of polyimide film;
    disposing the rigid flex cable assembly between a top platen and a bottom platen, wherein a flexible portion of the rigid flex cable assembly is exposed;
    applying a suitable pressure at a suitable temperature to the rigid flex cable assembly such that the one or more layers of polyimide film do not move with respect to one another during the fabrication.

12. The method according to claim 11, wherein the pressure is between 1 psi and 10 psi.

13. The method according to claim 11, wherein the temperature is about 23° C.

14. The method according to claim 11, wherein the electrically-conductive surface is selected from the group consisting of: copper, gold, nickel, silver, aluminum, composites of copper and tin or lead alloy, composites of copper, nickel and antimony, composites of copper, nickel and gold, and composites of nickel, gold and silver.

15. The method according to claim 11, wherein the electrically-conductive surface is arranged on a top side, a bottom side, or both, of the polyimide film.

16. The method according to claim 11, wherein the pressure is applied for about 30 minutes.

17. The method according to claim 11, wherein the adhesive is selected from the group consisting of: an acrylic-based adhesive, a room temperature curing silicone adhesive, a solvent blocked silicone adhesive, a flexible anaerobic adhesive and a frozen preform adhesive.

* * * * *